: US006104739A

United States Patent [19]
Hong et al.

[11] Patent Number: 6,104,739
[45] Date of Patent: Aug. 15, 2000

[54] SERIES OF STRONGLY COMPLEX COUPLED DFB LASERS

[75] Inventors: Jin Hong, Nepean; Hyung B. Kim, Kanata; Toshihiko Makino, Nepean, all of Canada

[73] Assignee: Nortel Networks Corporation, Montreal, Canada

[21] Appl. No.: 08/998,071

[22] Filed: Dec. 24, 1997

[51] Int. Cl.[7] .................................. H01S 3/19; H01S 3/08
[52] U.S. Cl. ................................ 372/50; 372/96; 372/23; 372/102
[58] Field of Search ............................. 372/96, 50, 102, 372/23, 45, 46, 92, 19, 20

[56] References Cited

U.S. PATENT DOCUMENTS

| | | | |
|---|---|---|---|
| 4,885,753 | 12/1989 | Okai et al. | 372/45.46 |
| 4,980,895 | 12/1990 | Nishimura | 372/96 |
| 4,993,036 | 2/1991 | Ikeda et al. | 372/50 |
| 5,077,752 | 12/1991 | Tada et al. | 372/96 |
| 5,091,916 | 2/1992 | Cimini, Jr. et al. | 372/96 |
| 5,452,318 | 9/1995 | Makino et al. | 372/96 |
| 5,936,994 | 8/1999 | Hong et al. | 372/96 |

OTHER PUBLICATIONS

H.M. Stoll et al., "Multiply Resonant Distributed–Feedback Lasers", IEEE J. Quantum Elect., vol. QE–12, No. 1, pp. 53–57, Jan. 1976.
"Coupled–mode theory of distributed feedback lasers", J. Appl. Phys., vol. 43, No. 5, pp. 2327–2335, 1972. (May).
"λ/4–shifted InGaAsP/InP DFB lasers", IEEE J. of Quantum Electronics, vol. QE–22, No. 7, pp. 1042–1051 (1986). (Jul.).

"Sahlen, O., et al, A Robust WDM Network Laser Source: The DFB–Cascade Laser", Proceedings of the Optical Fiber Conference 1997 (OFC '97), Dallas, USA, Feb. 16–12, 1997, OSA Technical Digest Series, vol. 6, pp. 235–236.
LU, H., et al, "Dynamic Properties of Partly Gain–Coupled 1.55 uM DFB Lasers", IEEE Journal of Quantum Electronics, vol. 31, No. 8, Aug. 1, 1995, pp. 1443–1450.
Flanigan, B.J., et al, "Mode Selection in Complex–Coupled Semiconductor DFB Lasers", Electronics Letters, vol. 31, No. 12, Jun. 8, 1995, pp. 977–979.

*Primary Examiner*—Rodney Bovernick
*Assistant Examiner*—Michael J. Stahl
*Attorney, Agent, or Firm*—Victoria Donnelly

[57] ABSTRACT

A one dimensional series of complex coupled (gain or loss coupled) DFB semiconductor lasers is disclosed. Each laser comprises a multiple quantum well active region and a complex coupled grating having corrugations along a cavity length direction formed by periodically etching grooves through the active region. The grating has a period comprising a first section and a second section, wherein substantially all quantum wells are etched away from the second section providing no substantial photon generation in the second section. The depth of etching is defined so as to provide a substantial insensitivity of each laser to the external feedback and random facet variations and to ensure no substantial interaction between lasers in the series. The lasers in the series may further comprise means for tuning laser wavelengths around corresponding lasing modes and/or means for switching between the lasing modes. The series of lasers is also capable of simultaneous multi-wavelength generation, with the number of generated wavelengths being equal to a number of lasers in the series excited above threshold levels.

28 Claims, 5 Drawing Sheets

SERIES OF STRONGLY COMPLEX COUPLED DFB LASERS

FIELD OF INVENTION

The invention relates to semiconductor lasers, and in particular, to complex coupled distributed feedback (DFB) semiconductor lasers arranged coaxially in series and capable of multi-wavelength generation and extended wavelength tuning range.

BACKGROUND OF THE INVENTION

Fiber optics communication systems require compact light emitting sources capable of generating single-mode, tunable, narrow linewidth radiation in the 1.3–1.56 $\mu$m wavelength range. Some of the existing semiconductor lasers, for example, InGaAsP DFB lasers can meet requirements for high power and proper wavelength, but fail to satisfy requirements for high side mode suppression ratio (SMSR), predictability and controllability of generated wavelength, insensitivity to external feedback and random facet phase variations, simple manufacturing and high device yield. Additionally, a rapid advance in high speed and large capacity dense wavelength division multiplexing (DWDM) fiber optics systems continues to demand semiconductor lasers not only possessing properties mentioned above but also capable of providing a wide continuous tuning range and multi-wavelength generation for practical and cost effective applications.

Conventional index coupled DFB lasers employing an index corrugation have an inherent problem in existence of two longitudinal modes with an equal threshold gain which results in poor single mode operation as shown, for example, in the article by H. Kogelnik and C. V. Shank "Coupled-mode theory of distributed feedback lasers", J. Appl. Phys., vol. 43, no. 5, pp. 2327–2335, 1972.

For index coupled DFB lasers, the longer and shorter wavelength Bragg modes around the laser stop band are intrinsically degenerate in terms of the threshold gain. The degeneracy may be broken, for example, in the presence of asymmetric facet coatings and facet phase variations. The yield of DFB lasers with a fixed lasing wavelength and a predetermined SMSR is very low in practice because of the random variations of facet phase, yield usually being not more than several percent. Without internal built-in mode discrimination between the two degenerate modes, mode properties of index coupled DFB lasers are primarily determined by asymmetric facet coatings and variations of facet phases. As a result these lasers are very sensitive to variations of the effective laser facet phases and can be strongly influenced by any external feedback.

For quarter wavelength shifted DFB lasers, described, for example, in the article by K. Utaka, S. Akiba, K. Sakai, and Y. Matsushima "$\lambda$/4-shifted InGaAsP/InP DFB lasers", IEEE J. of Quantum Electronics, Vol. QE-22, no.7, p.1042–1052 (1986), an additional phase shift is introduced into the laser structure to break the degeneracy between the two Bragg modes around the stop band. The yield of this type of lasers ensuring single-mode operation is higher than the conventional index coupled DFB lasers. However, since the laser operation is based upon an additional phase introduced into the structure, it is critically dependent on the phase shift which has been actually introduced to the laser and which is very difficult to control or manufacture in large scale. The laser facet phase still plays a significant role since it works together with the introduced built-in phase to satisfy the round-trip phase condition for resonance. A good anti-reflection (AR/AR) coating can reduce the effect of the facet phase on the laser properties. However, the quarter wavelength shift laser usually suffers from a large longitudinal spatial-hole burning (SHB), resulting from the phase shift introduced in the center of the laser, especially when a large index coupling is required to reduce a threshold current in the case of AR/AR coating. Strong SHB may quickly degrade the SMSR when the injection current is increased.

When a laser is facet phase sensitive or critically dependent on the phase shift introduced within the cavity, it becomes very sensitive to any perturbations or variations in its operation conditions. When a number of such lasers are arranged in a series, they interact with each other. The presence of one laser influences the operation of other lasers. One laser usually acts as an effective grating-based reflector to cause reflections fed back into other lasers to vary not only in amplitude, but also in phase, both being wavelength dependent. Additionally, both the amplitude and the phase are also dependent on the operation conditions of adjacent lasers, such as temperature, injection current and leakage current between the lasers. Thus, interaction between lasers significantly influences lasing behaviour of each laser, resulting in an extremely low device yield and poor laser performance. Often stable operation of the series as a whole is impossible.

O. Sahlen, L. Lundqvist, J. Terlecki and J. P. Weber in the article "A robust WDM network laser source: the DFB-series laser", ThB1, OFC'97, Dallas, USA, described an attempt to use quarter wavelength shifted DFB lasers as building blocks in a series. Although quarter wavelength shifted DFB lasers exhibit a high single mode yield in theory, they suffer from a large spatial hole burning as discussed above. Their current tuning range is also relatively small due to the potential onset of other longitudinal modes caused by spatial hole burning. As a result, the series as a whole did not demonstrate high performance and stability, and simultaneous multi-wavelength operation was not reported at all.

The predictability of the lasing wavelength for each individual DFB laser is also a critical parameter for the series operation. Even if one of the lasers, working as a perfect single-mode laser, happens to lase on a wrong side of the stop band, the entire series will fail in its operation. The same result will happen if one laser unexpectedly switches between the two Bragg modes, which is unacceptable for practical system applications.

Therefore, in order to obtain a good performance of series DFB lasers, it is critical to ensure that each laser operates substantially independently and has no influence on the lasing behaviour of other lasers in the series, thus, providing no substantial interaction between lasers in the series, each laser maintaining high performance characteristics at the same time.

SUMMARY OF THE INVENTION

It is an object of the present invention to provide a series of DFB semiconductor lasers which avoids the mentioned problems.

Thus, according to one aspect of the present invention there is provided a series of semiconductor lasers having an output facet, comprising:

a plurality of complex coupled distributed feedback semiconductor lasers having laser cavities arranged in a series coaxially along same optical axis, each laser comprising:
  a) a substrate;
  b) an active region formed on the substrate and comprising a multiple quantum well structure;

c) an excitation means for pumping the active region;

d) a complex coupled grating having corrugations along the optical axis formed by periodic etching grooves through the active region, the grating having a period comprising a first section and a second section, wherein substantially all quantum wells are etched away from the second section providing no substantial photon emission in the second section and ensuring no substantial interaction between lasers in the series, a Bragg wavelength of each laser in the series being outside the stop bands of all other lasers which are closer to the output facet of the series.

Preferably, a series of lasers has only one output facet and comprises two or more lasers. Each laser in the series may be either a gain coupled laser comprising a gain coupled grating or a loss coupled laser comprising a loss coupled grating. The series of gain coupled lasers is preferably arranged so that each laser in the series generates at the right Bragg mode around its stop band, and the Bragg modes of lasers differ so as to provide a continuous tuning range for the series as a whole. For the series of loss coupled lasers it is preferred for each laser to generate at the left Bragg mode around its stop band, and the Bragg modes of lasers to differ so as to provide a continuous tuning range for the series as a whole.

The series may further comprise means for tuning a laser wavelength of each laser around a corresponding lasing mode and/or means for wavelength switching between the lasing modes generated by lasers in the series. The series of lasers is also capable of multi-wavelength generation, with a number of generated wavelengths being equal to a number of lasers in the series excited above threshold levels.

The complex coupled grating, providing insensitivity of the laser to the external feedback and random facet phase variations, comprises a first section and a second section, wherein substantially all quantum wells are etched away from the second section. Thus, no substantial photon emission is generated in the second section. Height and shape of the sections define intensity of the photon emission in the sections. Conveniently, the first and second sections may have a rectangular or trapezoidal shape, or the second section may be V-shaped. Preferably, the grating is a first order uniform grating. Alternatively, it may be a chirped grating, depending on application requirements. The excitation means for pumping the active region comprises electrical contacts for current injection into the active region. Alternatively, the lasers in the series may be capable of coupling to external optical pumping sources to create population inversion. When the laser is electrically pumped, a current confining region is formed on the active region, the region being a ridge waveguide or a buried hetero-structure. Conveniently, lasers in the series are equally spaced from each other, with center to center spacing of respective lasers being about several micrometers.

By appropriate selection of semiconductor materials and type of dopings for substrate and current confining ridge, the lasers are adjusted to generate light within certain wavelength ranges. Preferably, they are 1.3–1.56 micrometers and 0.8–0.9 micrometers for InP and GaAs alloys utilized as substrate materials correspondingly.

Series of coaxial DFB lasers described above has a great advantage over parallel multi-wavelength laser arrays. It now provides emitting of multi-wavelength generation from one single common output facet only, which ensures more compact and cheap packaging. It also does not require optical combiners, which prevents power losses. Additionally, series of lasers provides a wide tunable wavelength range which can be made continuous by an appropriate choice of lasers' Bragg wavelengths.

According to another aspect of the present invention there is provided a complex coupled DFB semiconductor laser, comprising:

a) a substrate;

b) an active region formed on the substrate and comprising a multiple quantum well structure;

c) an excitation means for pumping the active region;

d) a complex coupled grating having corrugations along the optical axis formed by periodic etching grooves through the active region, the grating having a period comprising a first section and a second section, wherein substantially all quantum wells are etched away from the second section providing no substantial photon emission in the second section, and ensuring substantial insensitivity of the laser to the external feedback and random facet phase variations, and providing laser generation at a predetermined lasing mode.

The laser is a gain coupled laser comprising a gain coupled grating or a loss coupled laser comprising a loss coupled grating. It may further comprise means for tuning a laser wavelength around the lasing mode.

Thus, a coaxial series of DFB semiconductor lasers, insensitive to the external feedback and random facet phase variations, and capable of multi-wavelength generation and extended wavelength tuning range is provided.

BRIEF DESCRIPTION OF THE DRAWINGS

The invention will now be described in greater detail regarding the attached drawings in which.

DESCRIPTION OF THE PREFERRED EMBODIMENTS

STRUCTURE AND OPERATION

Figure 1:
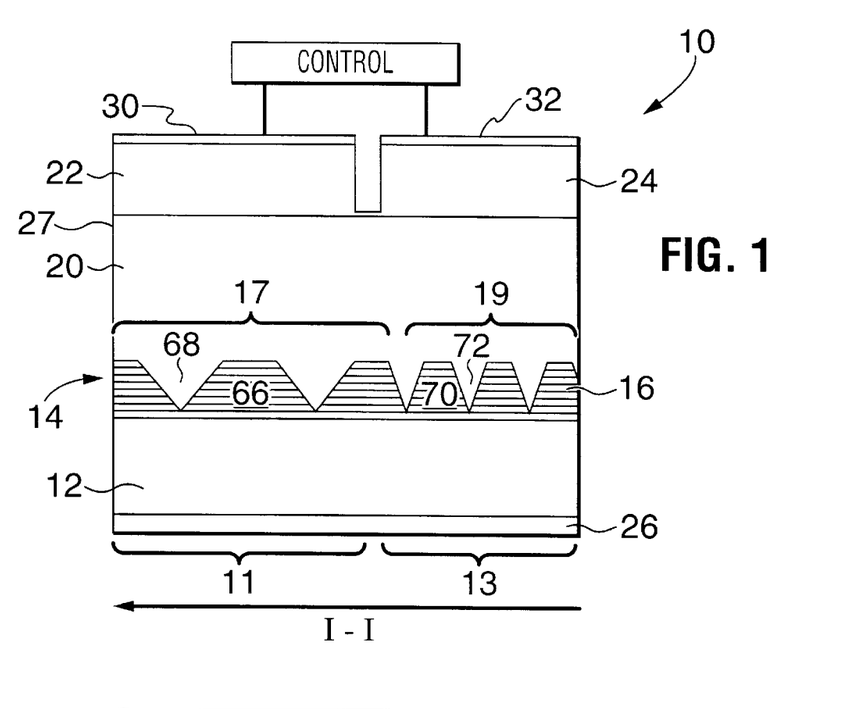
FIG. 1 is a schematic cross-sectional view of a series of DFB lasers according to a first embodiment of the invention.

A schematic cross section through a series of distributed feedback complex coupled semiconductor lasers 10 according to a first embodiment of the present invention is shown in FIG. 1. The series 10 comprises a first gain coupled DFB laser 11 and a second gain coupled DFB laser 13 having their cavities arranged coaxially along same optical axis, designated by a numeral I—I in FIG. 1. Lasers 11 and 13 have outputs arranged along the line I—I and in the same direction shown by an arrow on the line I—I, the first laser 11 being closer to an output facet 27 of the series 10. The series 10 is formed on a substrate 12 providing a first confinement region, an active region 14 comprising a multiple quantum well structure 16 and first and second gratings 17 and 19 defined therein, and an overlying confinement region 20. Means for excitation of the series are formed thereon, and include a contact to the substrate 26, first and second current confining ridges 22 and 24 defining first and second lasers 11 and 13, first and second contact electrodes 30 and 32 being defined on each ridge respectively for current injection into the series structure. The first and second gratings 17 and 19 positionally correspond to the first and second lasers of the series 11 and 13 respectively. The gratings have different grating periods, defining corresponding Bragg wavelengths and laser stop bands, and providing a 6 nm center Bragg wavelength separation of the gratings 17 and 19, the first grating 17 having a shorter Bragg wavelength. It is arranged that each laser generates at the same side of its stop band, namely at a right Bragg mode, and the Bragg modes of the lasers are arranged in such a way that the lasing wavelength (including intended current and temperature tuning) of the laser 13, which is farther from the output facet 27 of the series, does not fall within a stop band of the adjacent laser 11, which is closer to the output facet 27. It ensures that light generated by more distant laser 13 will pass through the laser 11 which is closer to the series output facet 27. Both gratings 17 and 19 are made by periodic etching grooves through the active region 14, the depth of etching being defined so as to provide a substantial insensitivity of each laser to the external feedback and random facet variations and thereby ensuring no substantial interaction between lasers in the series as will be described in detail below.

Figure 2:
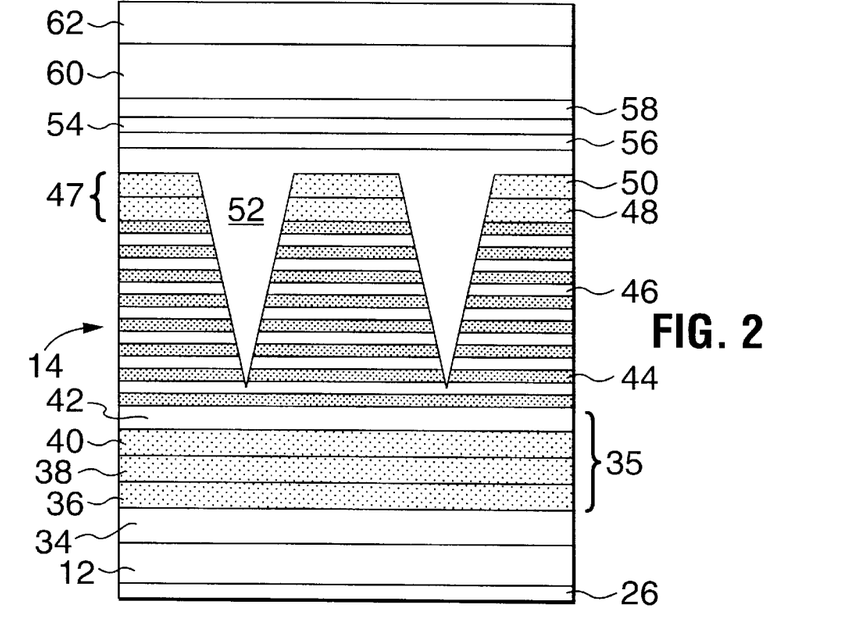
FIG. 2 is a detailed cross-sectional view of the series of lasers according to the first embodiment of the invention.
Figure 3:
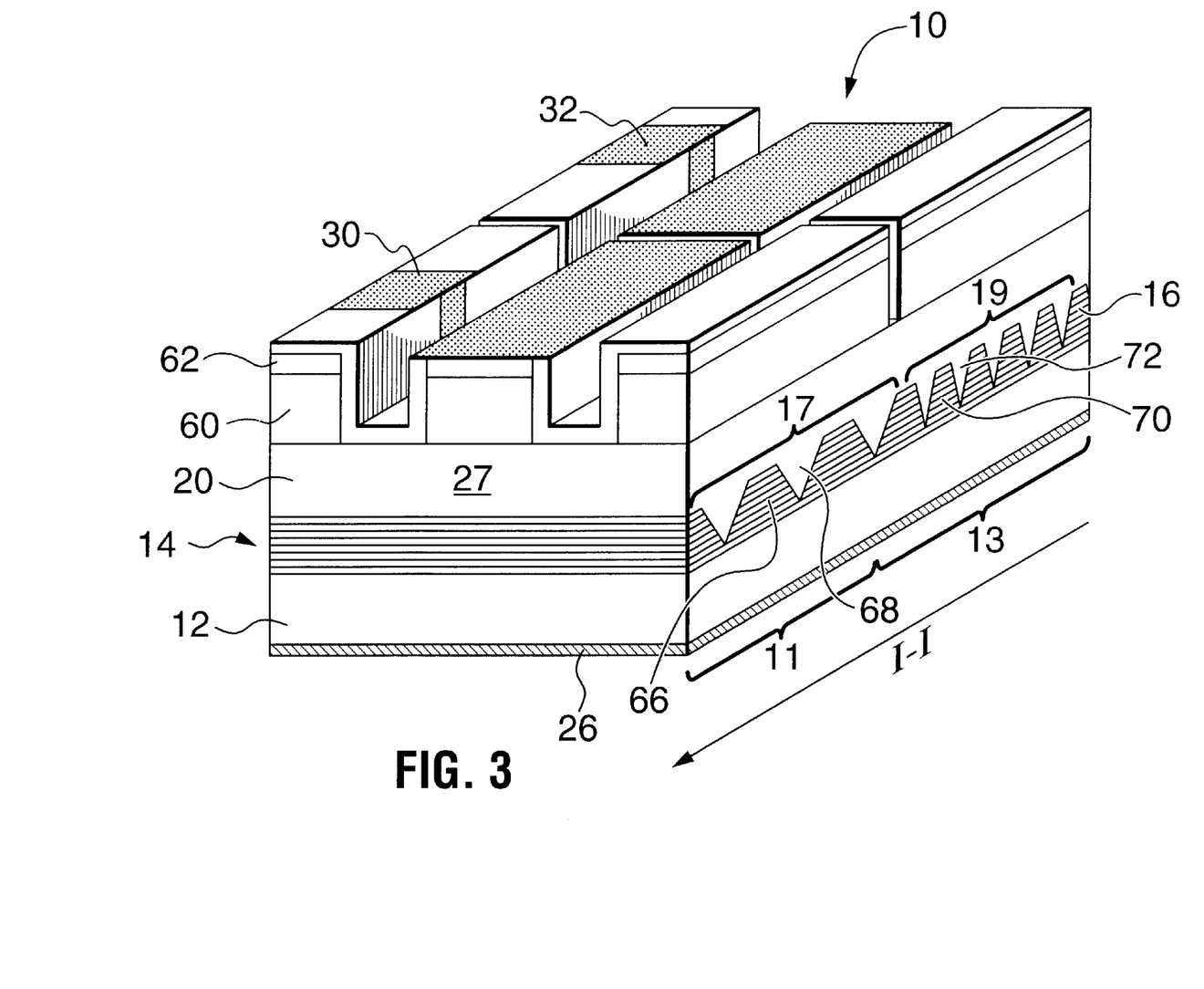
FIG. 3 is a perspective view of the series of the DFB lasers according to the first embodiment of the invention.

The structure of the series 10 is shown in more detail in FIG. 2, which shows an oblique cross-sectional view through the series structure 10, and FIG. 3 which shows a perspective view of the series 10. The DFB semiconductor laser series 10 is fabricated from Group III–V semiconductor materials, and comprises a heavily N-doped InP substrate 12, on which an P-doped InP buffer layer 34 of 1.5 $\mu$m thickness is defined. The first separate confinement region 35, consisting of four confinement layers 36, 38, 40 and 42 of P-doped InGaAsP with energy band gaps corresponding to wavelengths of 1.0 $\mu$m, 1.1 $\mu$m, 1.2 $\mu$m and 1.25 $\mu$m respectively, is provided over the buffer layer 34. The thickness of each confinement layer is 20 nm, and the confinement layer 36 corresponding to the 1.0 $\mu$m wavelength is adjacent to the buffer layer 34. The active region 14 overlies the confinement region 35 and comprises a multiple quantum well (MQW) structure 16 which includes eight 1% compressively strained P-doped InGaAsP quantum wells 44, each being 5 nm thick, separated by seven P-doped InGaAsP unstrained barriers 46 with a band gap corresponding to wavelength of 1.25 $\mu$m, each barrier being 10 nm thick. The alloy composition and layer thickness of the MQW structure 16 are tailored to have specific band gap energies to provide for lasing at a required wavelength. Increasing the number of quantum wells provides higher gain per unit length of the laser cavity. The band gap of the quantum well structure described above provides a lasing wavelength of the device at about 1.55 $\mu$m. A second separate confinement region 47, consisting of two P-doped InGaAsP confinement layers 48 and 50, having energy band gaps corresponding to 1.2 $\mu$m and 1.25 $\mu$m wavelengths respectively, is grown on top of the MQW active region 14, each layer being 20 nm thick.

As mentioned above, gratings 17 and 19 are defined by periodically etched grooves through the active region 14. The pitch of the groove of each grating is selected so as to define a first order grating for the lasing Bragg wavelength. Grating 17 has a period comprising a first section 66 and a second section 68 as shown in FIGS. 1 and 3. Grating 19 has corresponding first and second sections 70 and 72. Second sections 68 and 72 in the respective gratings 17 and 19 are V-shaped and characterized by substantially etching away almost all quantum wells, namely, seven out of eight quantum wells in this embodiment. The more quantum wells are etched away from the section the less is the photon generation in the section. Thus, a deep etching through the second sections 68 and 72 provides no substantial photon emission in these sections. Usually deep etching is avoided for a single laser because of the accompanied strong index coupling. For the series of DFB lasers, deep etching provides substantially independent generation of each laser in the series and no substantial interaction between lasers as will be described below.

A P-doped InP layer 52, having a band gap wavelength smaller than the quantum well band gap wavelength, fills the grooves of the gratings. A 3 nm thick etch stop layer 54 of P-doped InGaAsP, surrounded by P-doped InP buffer layer 56 at the bottom and P-doped InP buffer layer 58 at the top is formed next, the buffer layers being 100 nm and 200 nm thick correspondingly. An upper cladding layer 60 of P-type InP, followed by a highly doped P-type capping layer 62 of InGaAs for contact enhancement, having thickness 1600 nm and 200 nm correspondingly, complete the structure. The separation between the adjacent electrodes 30 and 32 is in the range of 5 to 15 $\mu$m to ensure both a sufficient electrical isolation between the adjacent electrodes and a limited material absorption loss. A bottom electrical N-contact 26 is provided at the bottom of the substrate 12. Corresponding means (not shown) for simultaneous multi-wavelength generation of the series of lasers (two wavelength generation in this embodiment), means for controllably varying current injection and changing temperature of each laser for switching between lasing modes, preferably within a time interval of several nanoseconds, and tuning of laser wavelength of each laser around a corresponding lasing mode are provided.

Thus, a coaxial series 10 of strongly gain coupled DFB semiconductor lasers is provided.

While the series described above is fabricated on a N-type substrate wafer, alternatively, a complementary structure may be fabricated on a P-type wafer.

The substrate 12 on which the series 10 described above is fabricated is made of InP material which results in generating a laser light within a range of 1.3–1.56 $\mu$m, corresponding to a transparency window of this material. In modifications of this embodiment, the substrate may be made of GaAs material, having a window of transparency in a shorter wavelength range of 0.8–0.9 $\mu$m, which results in generating light in this wavelength range. More precise calculation of a lasing wavelength depends also on the properties of the active region and the gratings. In the laser cavity direction, for lasing to occur, the grating period is determined by an integer multiple of $\lambda/2n$ where $\lambda$ is very close to the desired lasing wavelength, (typically within several nm), and n is the refractive index of the material, usually in a range of 3–4 for semiconductor materials.

In modifications of this embodiment, the series 10 may comprise first 11 and second 13 strongly loss coupled DFB lasers, each laser comprising a loss coupling grating 17 and 19 correspondingly. The gratings will then have periods, defining corresponding laser stop bands and a center Bragg wavelength separation, the first grating 17 having longer Bragg wavelength. It is also arranged that each laser generates at the left Bragg mode around its stop band, and the lasing wavelength of the laser 13, which is farther from the output facet 27 of the series, does not fall within the stop band of the adjacent laser 11, which is closer to the output facet 27. Deep etching through the quantum wells of the active regions provides strong loss coupling and independent generation of each laser.

In another modification of the present embodiment, gratings associated with particular lasers in a series may be either uniform or chirped gratings, and periods of the gratings may vary to provide a predetermined center Bragg wavelength separation (usually within a range of several nanometers to several tens of nanometers) to ensure continuous laser tuning within a certain wavelength range. A height and a shape of the first and second sections of gratings periods may also vary to define photon emission in the sections, which, for example, have rectangular or trapezoidal shape.

Principles of operation, demonstrated on a series of DFB lasers 10 of the first embodiment of the invention, are as follows.

It is known that complex coupled lasers provide an additional advantage over index coupled and quarter-wavelength shifted DFB lasers in suppressing one of the two originally degenerated Bragg modes. Both theory and experiment have confirmed that in-phase gain coupled DFB laser will predominantly lase on a longer wavelength side of the stop band (right Bragg mode), while the anti-phase loss coupled DFB laser will predominantly lase on a shorter wavelength side of the stop band (left Bragg mode).

The reasons behind this are as follows. For a gain coupled laser 11 with a grating 17 formed by direct etching through the active region, the second section of the grating period 68 where a portion of quantum wells is etched away, has smaller effective refractive index than the first section of the grating period 66 where the quantum wells are not etched at all. From a standing wave point of view, the first section 66 having higher refractive index, will support a photon emission at the longer wavelength, while the second section 68 having smaller refractive index, will support a photon emission at the shorter wavelength. Since there are more quantum wells in the first section 66 with a higher refractive index section, the emission at the longer wavelength will dominate. Nevertheless, if only a small portion of the quantum wells is etched away from the second section 68 of the grating period, a noticeable photon emission will be still generated in this section. In this case, there will be a chance that laser 11 will generate at the short wavelength (left Bragg mode) as a dominant mode on certain occasions, when a combination of external facet phases or external feedback phases is in favour to the short wavelength, the situation being typical for index coupled lasers. In order to eliminate such an unpredictable combination of phases, in the laser of the embodiment substantially all quantum wells from the second section 68 of the grating period are removed, to ensure that no substantial emission is originally generated in this section. This will result in the photon emission in the first section 66 predominantly, and hence in lasing at the longer wavelength side of the stop band (right Bragg mode) only. The lasing mode of such a laser is therefore determined by an internal built-in and distributed mode selection means, for example, by the grating defined by deep etching rather than by the external facet phase and coating asymmetry. When arranged in a series, each of such lasers, being phase insensitive and providing stable single mode operation under almost all phase combinations, ensures almost independent operation of each laser and no substantial interaction between adjacent lasers in series. We have called such a laser a "strongly gain coupled DFB laser" and utilized it as a building block for the series of DFB lasers 10.

To provide a path to the output facet 27 for light generated by all lasers in the series, it is necessary to satisfy certain requirements on laser wavelengths and pumping conditions. It is known that when an active region is pumped just above a transparency level (and below a threshold level), a DFB laser becomes transparent for a light passing through if a wavelength of the passing light is outside of the stop band. The same laser becomes lossy and not transparent for the light passing through if the wavelength of the passing light is within the stop band, regardless of the fact that the laser is pumped above the transparency level. Moreover, when the wavelength of the passing light is far enough from the stop band of the laser, it passes through the laser without substantial interaction even if the laser is pumped above a threshold level and generates a stable lasing mode by itself. Thus, for a particular laser in the series, it is necessary to generate light outside of the stop bands of all lasers which are closer to the output facet of the series to provide a path for light generated by each laser to the output facet. It may be conveniently arranged if each laser generates at the same side of its stop band, and Bragg wavelengths of lasers differ so as to provide a continuous tuning of the series as a whole. The principles described above are applied for both single wavelength tunable operation and the simultaneous multi-wavelength operation of the series of DFB lasers.

Figure 4:
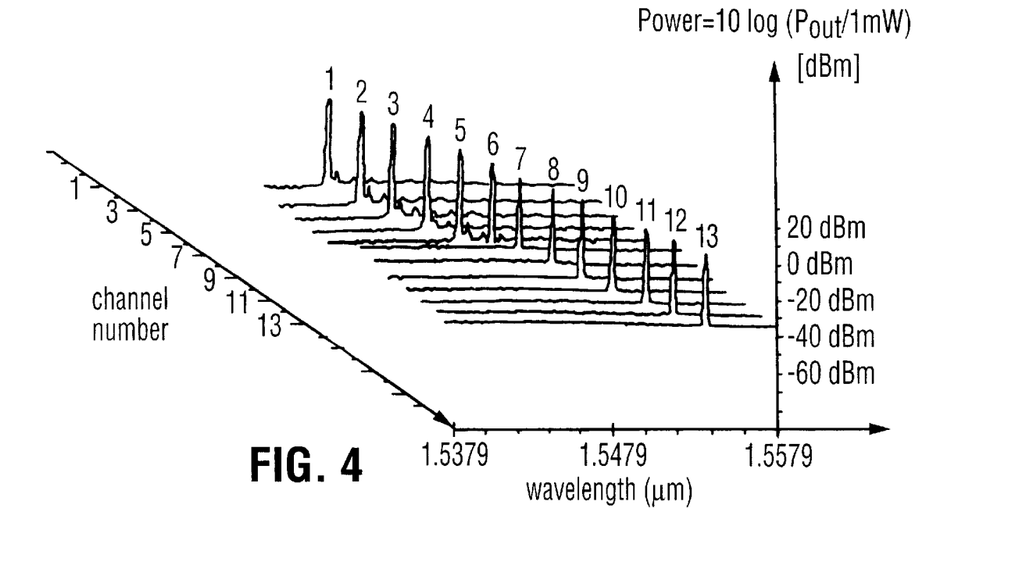
FIG. 4 is a combined wavelength tuning spectrum for the series of lasers according to the first embodiment of the invention.

FIG. 4 illustrates a continuous wavelength tuning range for the series 10 of two strongly gain coupled DFB lasers 11 and 13 of the first embodiment achieved by the current injection only.

For the series of two lasers of the first embodiment, there are two steps to obtain the entire tuning curve.

i) The first laser 11 is biased from 60 mA to about 180 mA to obtain a continuous current induced wavelength tuning around 6 nm, while the other laser 13 is not biased at all. The injection current is adjusted so as to have lasing wavelengths (laser channels) separated by 1 nm. The first lasing spectrum including channels numbered from 1 to 6 in the FIG. 4 correspond to the first tuning step.

ii) The first laser is biased at about 14 mA, which is slightly below the threshold and above the transparency level, in order to provide a transparent path for lasing emission generated by the second laser 13 to pass through the first laser 11 without substantial losses. Then the second laser 13 is biased from about 60 mA to about 180 mA to obtain another 6 nm current induced wavelength tuning range. The Bragg wavelength of the second laser 13 is designed to be 6 nm longer than the Bragg wavelength of the first laser 11 so that tuning ranges of the first and second lasers just adjoin each other and provide a combined continuous tuning range of about 12 nm. The channels numbered 7 to 13 in FIG. 4 are achieved by tuning the second laser 13 only, the first laser 11 being biased above the transparency level.

The output facet 27 from the series 10 is coupled into a low cost erbium doped fiber amplifier (EDFA) with the use of an optical isolator (both are not shown) to boost up an output power obtained from the series of lasers 10. It was demonstrated that the series of lasers 10 provides a stable single mode generation, an external feedback from the EDFA and another fiber connector not influencing the single mode operation due to the strong internal gain coupling of the lasers 11 and 13.

Thus, an overall continuous tuning range of about 12 nm is achieved in the series of two strongly gain coupled DFB lasers.

The series of DFB lasers described above provide not only a possibility of achieving a wide and stable wavelength tuning range, but also a simultaneous multi-wavelength operation with several well defined laser peaks and excellent adjacent side mode suppression. For example, two wavelength generation may be achieved for the series of two lasers 10, wherein a first wavelength may be chosen from the tuning range of the first laser 11, and a second wavelength may be chosen from the tuning range of the second laser 13. Compared with a parallel multi-wavelength laser array, the multi-wavelength generation is now emitted from one single common output port only (series output facet 27) which has a great advantage over parallel arrays by more compact and cheap packaging and avoiding power losses by not using optical combiners.

Figure 5:
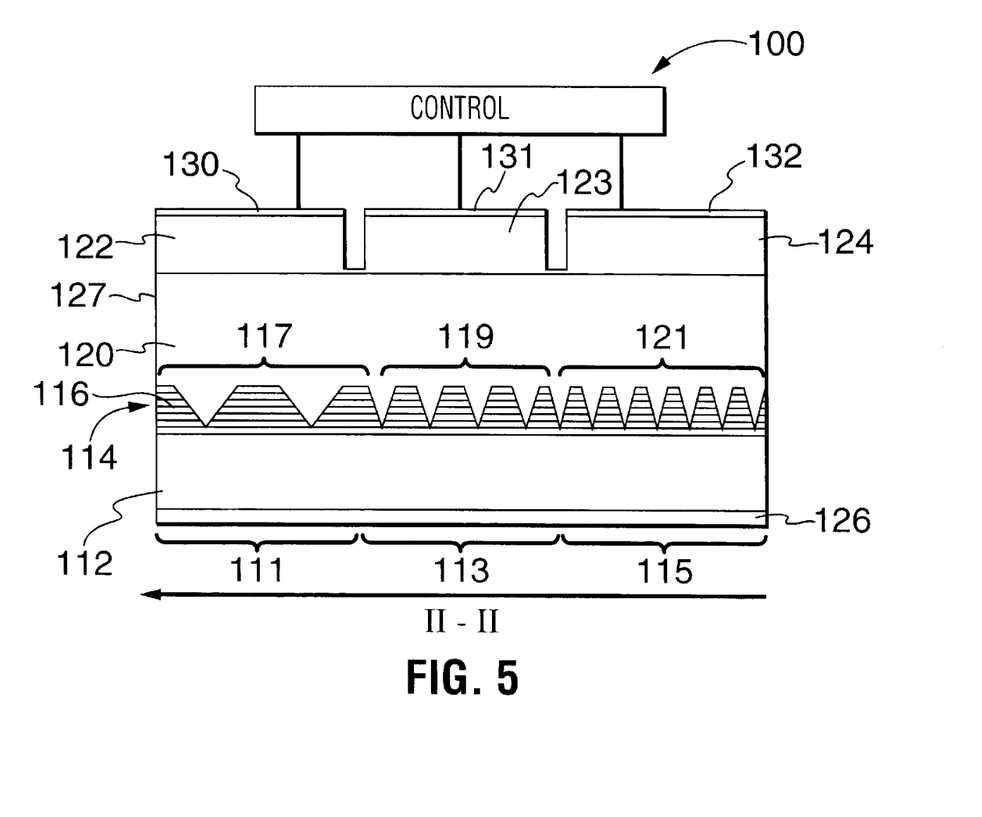
FIG. 5 is a schematic cross-sectional view of a series of DFB lasers according to a second embodiment of the invention.

A series of lasers 100 according to a second embodiment of the present invention is shown in FIG. 5. The series 100 of three lasers comprises a first DFB laser 111, a second DFB laser 113 and a third DFB laser 115 having their cavities arranged along one line, designated by numeral II—II in FIG. 5, and having a common single output 127 arranged along the line II—II and in the direction shown by an arrow on the line II—II. The series 100 is formed on a substrate 112 providing a first confinement region, an active region 114 comprising a multiple quantum well structure 116 and first, second and third gratings 117, 119 and 121 defined therein, and an overlying confinement region 120. Means for excitation of the series are formed thereon, and include a contact to the substrate 126, and first, second and third current confining ridges 122, 123 and 124 defining first, second and third lasers 111, 113 and 115 correspondingly, first, second and third contact electrodes 130, 131 and 132 being defined on each ridge respectively for current injection into the series structure. Three gratings 117, 119 and 121 positionally correspond to the first, second and third lasers of the series 111, 113 and 115 respectively. All three gratings 117, 119 and 121 are made by periodic etching grooves through the active region 114, the depth of etching being defined as will be described in detail below. Periods of the gratings differ so as to provide a 6 nm center Bragg wavelength separation of adjacent gratings. The lasers are equally spaced apart from each other, the separation being about 3 micrometers. The rest of the structure of the series 100 and its operation are similar to that of the previous embodiment described above.

Figure 6A:
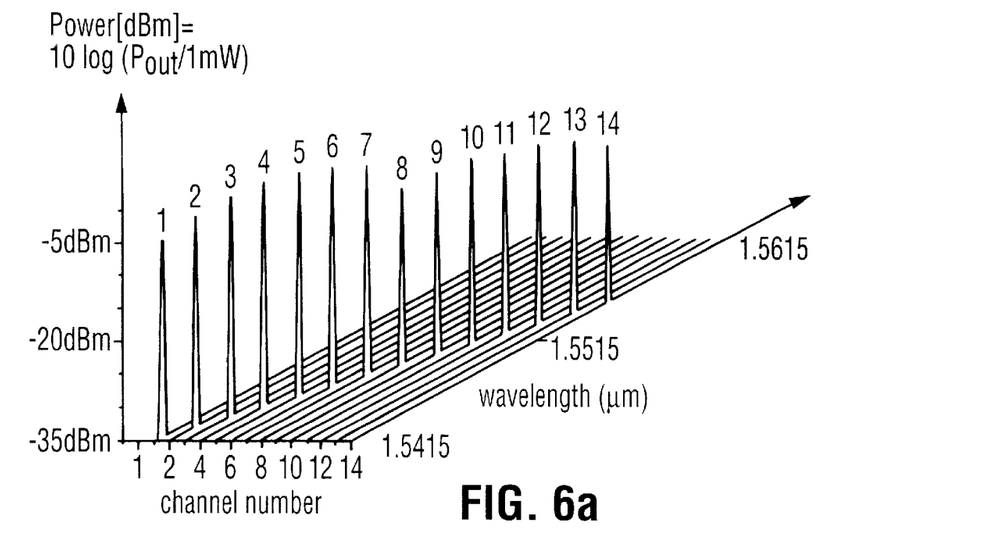
FIGS. 6a and 6b is a combined wavelength tuning spectra for the series of lasers according to the second embodiment of the invention.
Figure 6B:
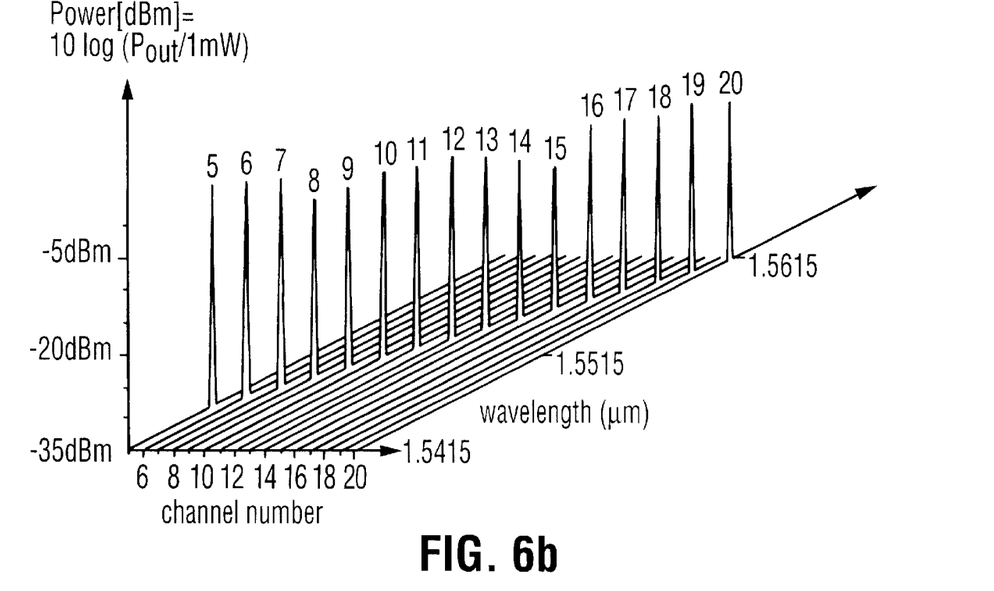

FIGS. 6a and 6b illustrate a continuous wavelength tuning of the series of three strongly gain coupled DFB lasers achieved by current injection only. Due to the strong gain coupling, the single mode property for each laser is well maintained over the entire temperature and current range.

For the series of three lasers, there are three steps to obtain the entire tuning curve.

i) The first laser 111 is biased from 60 mA to about 180 mA to obtain a continuous current induced wavelength tuning around 6 nm, while the other two lasers 113 and 115 are not biased at all. The injection current is adjusted so as to have lasing wavelengths (laser channels) separated by 1 nm. The first lasing spectrum including channels numbered from 1 to 6 in the FIG. 6a correspond to the first tuning step.

ii) The first laser is biased at about 14 mA, which is slightly below the threshold and above the transparency level, in order to provide a transparent path for a lasing emission generated by the second laser 113 to pass through the first laser 111 without substantial losses. Then the laser 113 is biased from about 60 mA to about 180 mA to obtain another 6 nm current induced wavelength tuning range. The Bragg wavelength of the second laser 113 is arranged to be 6 nm longer than the Bragg wavelength of the first laser 111, so that tuning ranges of the first and second lasers just adjoin each other and provide a combined continuous tuning range of 12 nm. The channels numbered by 7 to 12 in FIGS. 6a and 6b illustrate a lasing spectrum achieved by tuning the second laser 113 only, while the third laser 115 is not biased at all and the first laser 111 is biased above the transparency level. FIG. 6b partially repeats part of the FIG. 6a spectrum.

iii) The Bragg wavelength of the third laser 115 is arranged to be 12 nm longer than the Bragg wavelength of the first laser 111 and 6 nm longer than the Bragg wavelength of the second laser 113. When the first and second lasers 111 and 113 are biased above the transparency level as described above, the bias current of the third laser 115 is varied from about 60 mA to about 220 mA to obtain another continuous wavelength tuning range of the order of 8 nm. The channels numbered from 13 to 20 in FIG. 6b indicate 8 channels, each separated by 1 nm, achieved in the third tuning step. FIGS. 6a and 6b are obtained for the same series of three lasers and aligned according to the channel numbers.

Thus, an overall 20 nm continuous tuning range is achieved for the series of three strongly coupled DFB lasers.

The series of three lasers is also capable of simultaneous multi-wavelength generation, wherein the number of generated wavelengths is equal to the number of lasers in the series excited above threshold levels. For example, for the series of three lasers, it is possible to achieve one, two or three wavelength generation, depending on the number of lasers simultaneously pumped above threshold. Each of the generated wavelengths may be chosen from the tuning range of the corresponding laser, and the multi-wavelength generation is emitted through the single common output port only.

Figure 7:
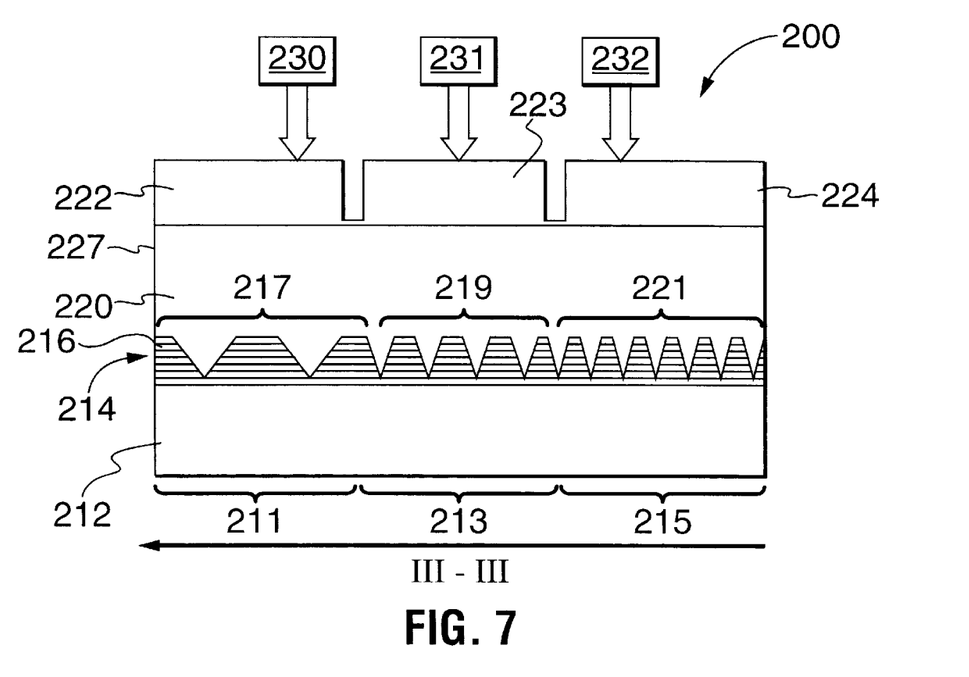
FIG. 7 is a schematic cross-sectional view of a series of DFB lasers according to a third embodiment of the invention.

The series of semiconductor lasers of the embodiments described above comprises semiconductor diode lasers, i.e., lasers having contacts for electrical excitation of the active region by current injection. It is also contemplated that a series 200 of yet another embodiment, shown in FIG. 7, may be provided with optical pumping means 230, 231 and 232, replacing corresponding electrical contacts 130, 131 and 132 of the second embodiment (or corresponding contacts 30 and 32 of the first embodiment), e.g., by providing population inversion with suitable optical coupling to another light source on the substrate. The series 200 according to this embodiment comprises a first excitation means 230, a second excitation means 231 and a third excitation means 232 for an independent pumping of the first 211, second 213 and third 215 lasers axially distinct along a cavity length direction designated by a numeral III—III in FIG. 7, and having a single common output 227 arranged along the line III—III and in the direction shown by an arrow on the line III—III. Means for varying the pumping of one laser with respect to the pumping of another, means for tuning a laser wavelength around the corresponding lasing mode and means for switching between lasing modes are also provided (all of them are not shown). The rest of the structure of the series 200 is similar to that of the previous embodiments described above. It comprises a substrate 212 providing a first separate confinement region, an active region 214 comprising a MQW structure 216 and a first, second and third gratings 217, 219 and 221 defined therein, and an overlying confinement region 220. First, second and third confining ridges 222, 223 and 224 define first, second and third lasers 211, 213 and 215 as described above.

In the embodiments described above, the series of lasers comprises two or three gain coupled DFB lasers. It is also contemplated that a series of yet another embodiment may comprise any reasonable number of DFB lasers arranged along one line, each laser being gain coupled or loss coupled laser. Preferably, the lasers have outputs in the same direction and from the same output facet of the series, with number of lasers in the series depending on losses and other restricting factors. It is preferably arranged that each laser generates at the right Bragg mode around its stop band for gain coupled lasers or at the left Bragg mode for loss coupled lasers, and the lasing wavelength of each laser which is farther from the output facet of the series, including current and temperature tuning, does not fall within the stop bands of the lasers which are closer to the output facet. It will ensure that light generated by a more distant laser will pass through the system without substantial losses. Any other arrangement for Bragg wavelengths of the lasers, providing a transparent path to the output facet, is also acceptable. Preferably, a center Bragg wavelength separation of lasers in the series is chosen to provide a continuous wavelength tuning range for the series as a whole.

It is also contemplated that a series of alternative embodiments may comprise buried heterostructure lasers in contrast to the ridge waveguide lasers described in the above embodiments.

Series of strongly complex coupled DFB lasers described above have advantages over other similar structures which can be summarized as follows.

Each laser in the series provides an excellent SMSR over the entire tuning range due to the removal of left Bragg mode from generation. There is very little chance for one laser to switch from the right Bragg mode to the left Bragg mode due to the intrinsic structure of the laser itself.

There is no substantial interaction among series lasers due to the insensitivity of each laser to facet phase and facet reflection amplitude, and therefore to external effective feedback or optical injection from external source, such as the adjacent series laser.

The series provides a high series yield due to the high single mode yield of each laser in a strongly gain coupled series and reduced interaction between lasers.

The series of strongly coupled lasers provides more simple manufacturing. Due to insensitivity of lasers to facet phases and the interaction between lasers, control of manufacturing of the series is less stringent, and testing of such lasers is more straightforward.

The series of strongly coupled DFB lasers provides a high predictability and controllability of laser wavelength. Since each laser generates at a predetermined right Bragg mode, and there is very little chance for the mode to switch to the left Bragg mode, the entire tuning range is continuous for both current and temperature tuning, and the lasing wavelength can be simply predicted and controlled in the practical system applications.

Since several DFB lasers are arranged in series along the cavity length direction, all lasers' outputs go through the common output facet. This eliminates a need for an optical combiner required in the common parallel array approach, and as a result, there is no power loss due to the use of the combiner. Since the series of lasers has only one output port, it can be easily integrated with other optical devices, such as electro-absorption modulators, Mach-Zender modulators, detectors, tunable filters. It greatly simplifies module packaging and significantly reduces overall costs of the system implementation.

FABRICATION

Fabrication of the series of strongly gain coupled DFB semiconductor lasers 10 according to the first embodiment shown in FIG. 1 proceeds in four stages as follows:

1. first epitaxial growth of substrate and multiple quantum well structure;
2. patterning of the grating structure;
3. second epitaxial growth of the overlying layers;
4. completion of the laser fabricating (e.g. ridge formation, contacts).

The prepared substrate 12 is loaded promptly into a commercially available CVD growth chamber, and a buffer layer 34 of InP followed by the first confinement region 35, including four layers of InGaAsP, is grown. The active region 14, comprising eight 1% compressively strained P-doped InGaAsP quantum wells 44, separated by seven P-doped InGaAsP unstrained barriers 46, is grown next.

The wafer is then removed from the growth chamber and processed so as to form photolithographically gratings 17 and 19 by periodically etched grooves through the active region 14. First, a dielectric such as $SiO_2$ (not shown) is grown on the surface of the wafer, and the groove pattern is created in the dielectric layer. The grooves are etched using reactive ion etching or wet chemical etching process. The residual dielectric is then removed. Using known crystal growth techniques, for example, a metal oxide chemical vapor deposition, an InP layer 52 is grown in the grooves. Etch stop layer 54 of InGaAsP grown between two buffer layers 56 and 58 of InP, followed by cladding layer 60 of InP and capping layer 62 of InGaAs complete the structure. Series fabricating is then completed using a standard process. For example, to form rectangular ridge waveguides 22 and 24 perpendicular to the grooves of the gratings 17 and 19, a ridge mask is provided on the substrate, and the ridges are formed by etching through the capping layer 62 and top cladding layer 60, the ridges being 2 $\mu$m nominal width. The split top electrodes 30 and 32 are defined by the mask used in the metalization step and created in the lift-off process. The output facet 27 of the series is AR-coated (anti-reflection coated). The back facet may be AR-coated, as-cleaved or HR-coated (high-reflection coated). Alternatively, after the second regrowth, when a current confining region is formed on the active region, a buried heterostructure may also be grown. A phase mask generated by Electron Beam (EB) lithography or direct EB writing on wafer may be used as an alternative to a wet etching process for grating formation.

Thus, it will be appreciated that, while specific embodiments of the invention are described in detail above, numerous variations, modifications and combinations of these embodiments fall within the scope of the invention as defined in the following claims.

What is claimed is:

1. A series of semiconductor lasers having an output facet, comprising:

a plurality of complex coupled distributed feedback semiconductor lasers having laser cavities arranged in a series coaxially along same optical axis, each laser comprising:
(a) substrate;
(b) an active region formed on the substrate and comprising a multiple quantum well structure;
(c) an excitation means for pumping the active region;
(d) a complex coupled grating having corrugations along the optical axis formed by periodic etching grooves through the active region, the grating having a period comprising a first section and a second section, wherein substantially all quantum wells are removed away from the second section so as to provide no substantial photon emission in the second section resulting in gain coupling and index coupling of the laser of such a magnitude that ensures no substantial interaction between lasers in the series, stable generation of light in the presence of other lasers in the series and provides the required stop-band of the laser;

a Bragg wavelength of each laser in the series being outside the stop bands of all other lasers which are closer to the output facet of the series.

2. A series of lasers as defined in claim 1, wherein the series has only one output facet.

3. A series of lasers as defined in claim 2, wherein each laser is a gain coupled laser comprising a gain coupled grating.

4. A series of lasers as defined in claim 2, wherein each laser is a loss coupled laser comprising a loss coupled grating.

5. A series of lasers as defined in claim 3, wherein each laser generates at the right Bragg mode around its stop band, and the Bragg modes of lasers differ so as to provide a continuous tuning range for the series as a whole.

6. A series of lasers as defined in claim 4, wherein each laser generates at the left Bragg mode around its stop band, and the Bragg modes of lasers differ so as to provide a continuous tuning range for the series as a whole.

7. A series of lasers as defined in claim 1, further comprising means for tuning a laser wavelength of each laser around a corresponding lasing mode.

8. A series of lasers as defined in claim 1, capable of multi-wavelength generation, wherein the number of generated wavelengths is equal to a number of lasers in the series excited above threshold levels.

9. A series of lasers as defined in claim 1, further comprising means for wavelength switching between lasing modes generated by lasers in the series.

10. A series of lasers as defined in claim 9, wherein the means for wavelength switching provides switching within a time interval of several nanoseconds.

11. A series of lasers as defined in claim 1, wherein a height and a shape of the sections of the grating period define photon emission in the sections.

12. A series of lasers as defined in claim 11, wherein the first and second sections have a rectangular or trapezoidal shape.

13. A series of lasers as defined in claim 11, wherein the second section is V-shaped.

14. A series of lasers as defined in claim 1, wherein the grating is a first order grating.

15. A series of lasers as defined in claim 1, wherein the grating is a chirped grating.

16. A series of lasers as defined in claim 1, wherein the means for pumping the active region comprises electrical contacts for current injection into the active region.

17. A series of lasers as defined in claim 16, wherein a current confining region is formed on the active region.

18. A series of lasers as defined in claim 17, wherein the current confining region is a ridge waveguide.

19. A series of lasers as defined in claim 17, wherein the current confining region is a buried heterostructure.

20. A series of lasers as defined in claim 1, wherein the means for pumping the active region comprises an external optical pumping source.

21. A series of lasers as defined in claim 18, wherein the substrate is p-type and the ridge is N-type.

22. A series of lasers as defined in claim 18, wherein the substrate is N-type and the ridge is P-type.

23. A series of lasers as defined in claim 17, wherein the substrate is InP.

24. A series of lasers as defined in claim 23, capable of generating light in the wavelength range of 1.3–1.56 micrometers.

25. A series of lasers as defined in claim 17, wherein the substrate is GaAs.

26. A series of lasers as defined in claim 25, capable of generating light in the wavelength range of 0.80–0.9 micrometers.

27. A series of lasers as defined in claim 1, wherein the lasers in the series are equally spaced from each other.

28. A series of lasers as defined in claim 27, wherein the center to center spacing of respective lasers is within a range of several micrometers.

* * * * *